(12) United States Patent
Franchi et al.

(10) Patent No.: US 12,446,272 B2
(45) Date of Patent: Oct. 14, 2025

(54) SEMICONDUCTOR DEVICES AND METHODS OF MANUFACTURING SEMICONDUCTOR DEVICES

(71) Applicant: SEMICONDUCTOR COMPONENTS INDUSTRIES, LLC, Phoenix, AZ (US)

(72) Inventors: Jimmy Robert Hannes Franchi, Enköping (SE); Martin Domeij, Sollentuna (SE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 391 days.

(21) Appl. No.: 18/058,915

(22) Filed: Nov. 28, 2022

(65) Prior Publication Data

US 2024/0178269 A1    May 30, 2024

(51) Int. Cl.
| | |
|---|---|
| H10D 62/10 | (2025.01) |
| H01L 21/04 | (2006.01) |
| H10D 12/01 | (2025.01) |
| H10D 30/66 | (2025.01) |
| H10D 62/17 | (2025.01) |
| H10D 62/832 | (2025.01) |

(52) U.S. Cl.
CPC ....... H10D 62/109 (2025.01); H01L 21/0465 (2013.01); H10D 12/031 (2025.01); H10D 30/66 (2025.01); H10D 62/393 (2025.01); H10D 62/8325 (2025.01)

(58) Field of Classification Search
None
See application file for complete search history.

(56) References Cited

U.S. PATENT DOCUMENTS

| | | |
|---|---|---|
| 7,221,010 B2 | 5/2007 | Ryu |
| 10,504,995 B1 | 12/2019 | Domeij |

(Continued)

FOREIGN PATENT DOCUMENTS

WO    2017147296 A1    8/2017

OTHER PUBLICATIONS

International Search Report, Application No., PCT/US2023/073298, mailed Jan. 5, 2024.

(Continued)

*Primary Examiner* — Jack S Chen
(74) *Attorney, Agent, or Firm* — Kevin B. Jackson

(57) ABSTRACT

A method of making a semiconductor device includes providing semiconductor region of a first conductivity type. A first region comprising the first conductivity type and a second dopant concentration greater than the first dopant concentration is provided within the region. The first region provides a JFET channel region for a JFET device. A second region comprising a second conductivity type is provided within the first region. The second region provides a body region for a MOSFET device and a gate region for the JFET device. The second region comprises a first portion and a second portion below the first portion. The second portion has a higher peak dopant concentration than the first portion. A third region comprising the first conductivity type is provided within and self-aligned to the second region. The third region provides a JFET source for the JFET device.

17 Claims, 11 Drawing Sheets

(56) References Cited

U.S. PATENT DOCUMENTS

| | | |
|---|---|---|
| 2005/0032291 A1 | 2/2005 | Baliga |
| 2014/0264579 A1 | 9/2014 | Pala et al. |
| 2015/0108564 A1 | 4/2015 | Miura et al. |
| 2016/0276339 A1 | 9/2016 | Titus et al. |
| 2017/0054017 A1 | 2/2017 | Takaki et al. |
| 2021/0126123 A1 | 4/2021 | Schoner et al. |
| 2022/0069138 A1 | 3/2022 | Han et al. |
| 2024/0178269 A1* | 5/2024 | Franchi ............... H10D 30/662 |

OTHER PUBLICATIONS

Alexander Bolotnikov et al., "Optimization of 1700V SiC MOSFET for Short Circuit Ruggedness," Materials Science Forum, ISSN: 1662-9752, vol. 963, pp. 801-804, Aug. 2, 2019.

* cited by examiner

SEMICONDUCTOR DEVICES AND METHODS OF MANUFACTURING SEMICONDUCTOR DEVICES

CROSS-REFERENCE TO RELATED APPLICATIONS

Not applicable.

TECHNICAL FIELD

The present disclosure relates, in general, to electronics and, more particularly, to methods of forming semiconductor devices and semiconductor device structures.

BACKGROUND

Silicon Carbide (SiC) semiconductor devices, such as SiC MOSFETs, have several advantageous features, for example, in comparison to traditional silicon-based devices. For example, SiC MOSFETs are well-suited for high-power applications. SiC MOSFETs are capable of handling high voltages and high operating temperatures. Further, SiC MOSFETs have a low drain-to-source on-resistance (RDSON), (when designed with a short channel region) and fast switching with low power losses, resulting in highly-efficient operation. The short channel region design requirement is necessary because SiC MOSFETs have relatively low channel mobility compared to silicon-based devices.

A challenge resulting from the short channel requirement is that the short channel leads to poor drain current saturation, which can cause a SiC MOSFET to incur very high drain current at high drain-to-source voltages (VDS). In addition, because channel resistance has a negative dependence with temperature (i.e., resistance increases with increasing temperature), device performance is made worse as strong self-heating occurs during short-circuit operation. As a result, the short-circuit withstand time of a SiC MOSFET can be too short for an associated gate driver device to sense and turn off the SiC MOSFET before damage or failure occurs.

Poor short-circuit performance is an important issue because short-circuit events can occur in many widely used power electronics application, such as automotive traction inverters. Addressing this issue can also limit the minimum useable on-resistance of a SiC MOSFET. That is, there is a key trade-off between short-circuit performance and on-resistance performance in SiC MOSFETs, which is becoming more of a challenge as next generation devices are requiring lower on-resistance.

Accordingly, structures and methods are needed that provide reduced on-resistance and improved short-capability in SiC devices, such as SiC MOSFETs. It would be beneficial for such structures and methods to be cost effective and readily manufacturable.

Figure 1:
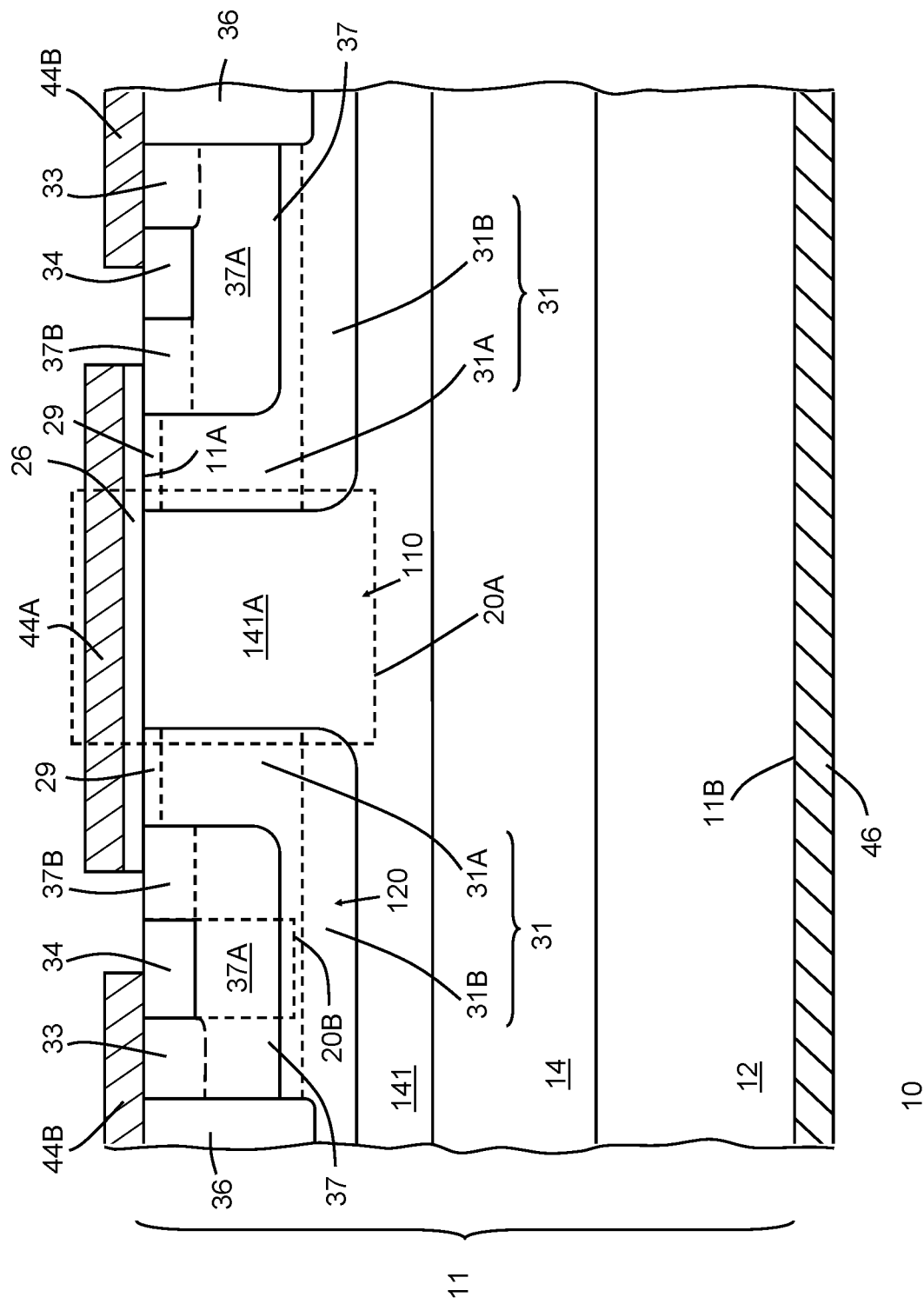
FIG. 1 illustrates a partial cross-sectional view of a semiconductor device in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", "including", "has", "have" and/or "having" when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DESCRIPTION

In general, the present examples relate to semiconductor device structures and methods of making semiconductor devices, such as SiC semiconductor devices, having improved short-circuit capability and durability. More particularly, a structure is described that uses a first controlled pinch resistance in a first JFET region on a drain side of the semiconductor device. In some examples, a second controlled pinch resistance is added as part of a second JFET region on a source side of the semiconductor device to provide a plurality of controlled pinch resistances. A method is described that uses self-aligned techniques that enable fabrication of a smaller cell pitch. In some examples, the structure and method further include providing a retrograde P-type well region and one or more high energy N-type ion implants for controlling the pinch resistance in the first JFET region on the drain side. The structures and methods provide, among other things, improved short-circuit capability and durability with a smaller impact on on-resistance compared to previously SiC semiconductor devices. This improved trade-off is beneficial in emerging applications, such as automotive inverters. The controlled pinch resistances are configured to provide short-circuit current saturation as an alternative to other approaches that reduce channel density or that increase channel length or series resistance.

In an example, a method for manufacturing a semiconductor device includes providing a body of semiconductor material comprising a substrate and a semiconductor region over the substrate and comprising a first conductivity type. The semiconductor region comprises a first side of the body of semiconductor and the substrate comprises a second side of the body of semiconductor material opposite to the first side. The method includes providing a first doped region comprising the first conductivity type within the semiconductor region. The first doped region provides a first JFET channel region for a first JFET device. The method includes providing a first mask over the first side comprising a first opening above the first doped region. The method includes providing a second doped region comprising a second conductivity type opposite to the first conductivity type within the first doped region. The second doped region provides a body region for a MOSFET device, a gate region for the first JFET device and a first JFET gate for a second JFET device. The method includes providing a first spacer structure within the first opening to define a second opening smaller than the first opening. The method includes providing a third doped region comprising the first conductivity type within the second doped region aligned to the second opening. The third doped region provides a second JFET channel region for the second JFET device, a first JFET source for the first JFET device, and a JFET drain for the second JFET device. The method includes providing a second spacer structure adjacent to the first spacer structure within the second opening to define a third opening smaller than the second opening. The method includes providing a fourth doped region comprising the second conductivity type within the third doped region aligned with the third opening. The fourth doped region provides a second JFET gate for the second JFET device. The method includes providing a fifth doped region comprising the first conductivity type adjacent to the fourth doped region. The fifth doped region provides a source for the MOSFET device and a second JFET source for the second JFET device. The method includes providing a sixth doped region comprising the second conductivity type extending through a portion of the fifth doped region and coupled to the second doped region. The sixth doped region provides a body contact for the MOSFET device and a gate contact to the first JFET gate for the second JFET device.

In an example, a method of manufacturing a semiconductor device includes providing a semiconductor substrate comprising a semiconductor region of a first conductivity type, a first side, and a second side opposite to the first side, the semiconductor region comprising a first dopant concentration. The semiconductor substrate provides a drain for a MOSFET device and a first JFET drain for a first JFET device. At least the semiconductor region comprises silicon carbide (SiC). The method includes providing a first doped region at the first side extending into the semiconductor region, comprising the first conductivity type and a second dopant concentration greater than the first dopant concentration. The first doped region provides a first JFET channel region of the first JFET device. The method includes providing a second doped region within the first doped region extending from the first side into the first doped region, comprising a second conductivity type opposite to the first conductivity type. The second doped region provides a body region for the MOSFET device and a gate region for the first JFET device, the second doped region comprises a first portion and a second portion, the first portion is interposed between the first side and the second portion, and the second portion has a higher peak dopant concentration than the first portion. The method includes providing a third doped region within and self-aligned to the second doped region and comprising first conductivity type, wherein the third doped region provides a first JFET source for the first JFET device.

In an example, a semiconductor device includes a semiconductor substrate comprising a semiconductor region of a first conductivity type, a first side, and a second side opposite to the first side. The semiconductor region comprises a first dopant concentration. The semiconductor substrate provides a drain for a MOSFET device and a first JFET drain for a first JFET device. At least the semiconductor region comprises silicon carbide (SiC). A first doped region is proximate to the first side and extends into the semiconductor region. The first doped region comprises the first conductivity type and a second dopant concentration greater than the first dopant concentration. The first doped region provides a first JFET channel region for the first JFET device. A second doped region is within the first doped region extending from the first side into the first doped region. The second doped region comprises a second conductivity type opposite to the first conductivity type. The second doped region provides a body region for the MOSFET device and a gate region for the first JFET device. The second doped region comprises a first portion and a second portion. the first portion is interposed between the first side and the second portion, and the second portion has a higher peak dopant concentration than the first portion. A third doped region comprising the first conductivity type is within and self-aligned to the second doped region. The third doped region provides a first JFET source for the first JFET device.

Other examples are included in the present disclosure. Such examples may be found in the figures, in the claims, or in the description of the present disclosure.

FIG. 1 illustrates a partial cross-sectional view of a semiconductor device 10 having improved short-circuit capability and durability in accordance with the present description. In the present example, semiconductor device 10 comprises a SiC MOSFET device and includes a first JFET device 110 (including a first JFET region 20A) on a drain side of the SiC MOSFET. In some examples, semiconductor device 10 further includes a second JFET device 120 (including a second JFET region 20B) on a source side of the SiC MOSFET. In accordance with the present description, the pinch resistance of the first JFET region 20A or the pinch resistances of both first JFET region 20A and second JFET region 20B can be controlled to improve the short-circuit capability and durability of semiconductor device 10.

In the present example, semiconductor device 10 comprises a body of semiconductor material 11, which can also be referred to as a region of semiconductor material or a semiconductor work piece. In some examples, body of semiconductor material 11 comprises a semiconductor substrate 12 and a semiconductor region 14 over or within substrate 12. Semiconductor substrate 12 can also be referred to as a substrate or a starting substrate. In some examples, substrate 12 comprises SiC and has an N-type conductivity. In some examples, semiconductor region 14 comprises an N-type conductivity SiC epitaxial layer formed over substrate 12.

In an example where semiconductor device 10 comprises a 1200 Volt (V) SiC MOSFET, substrate 12 can have a dopant concentration of about $5.0 \times 10^{18}$ atoms/cm$^3$. In the 1200 V example, semiconductor region 14 can have a thickness in range from about 8 microns to about 12 microns and a dopant concentration in a range from about $7.0 \times 10^{15}$ atoms/cm$^3$ to about $1.5 \times 10^{16}$ atoms/cm$^3$. It is understood that the thickness and dopant concentration (including dopant profile) of semiconductor region 14 can be adjusted in accordance with breakdown voltage or other device requirements. In some examples, the upper side of semiconductor region 14 provides or defines a top side 11A of body of semiconductor material 11, and the lower side of substrate 12 provides or defines a lower side 11B of body of semiconductor material 11. Lower side 11B is opposite to top side 11A. In the present example, substrate 12 provides a drain for the SiC MOSFET and a first drain region for first JFET device 110.

In accordance with the present description, semiconductor device 10 comprises a doped region 141 within semiconductor region 14 proximate to top side 11A. Doped region 141 extends inward from top side 11A into semiconductor region 14. In some examples, doped region 141 has a depth of about 1 micron to about 2 microns from top side 11A. In the present example, doped region 141 has N-type conductivity and provides a first JFET channel region 141A for first JFET device 110. In accordance with the present description, doped region 141 comprises a dopant concentration and dopant profile that are configurable to control the pinch resistance of first JFET device 110 thereby protecting semiconductor device 10 during a short-circuit event.

Figure 2:
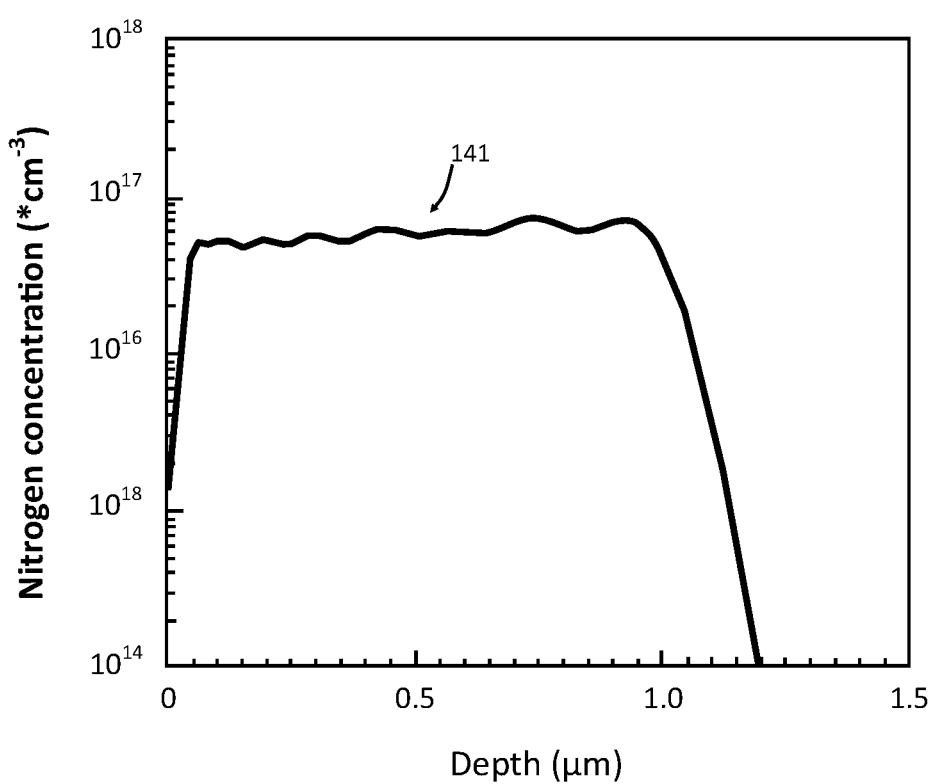
FIG. 2 illustrates a dopant profile for an example junction field effect transistor (JFET) channel region in accordance with the present description.

FIG. 2 shows an example dopant profile for doped region 141 suitable for a 1200 V device. In some examples, doped region 141 comprises a dopant concentration in a range from about $4.0 \times 10^{16}$ atoms/cm$^3$ to about $7.0 \times 10^{16}$ atoms/cm$^3$. In some examples, doped region 141 is provided using a plurality of doping steps, such as a plurality of ion implants with nitrogen as the N-type dopant source. In some examples, the plurality of ion implants includes at least a first ion implant dose at a first ion implant energy in a range from about 30 keV to about 320 keV and at least a second ion implant dose at a second ion implant energy in range from about 460 keV to about 900 keV. In some examples, the plurality of ion implant doses provides a cumulative ion implant dose between about $4.0 \times 10^{12}$ atoms/cm$^2$ and about $6.5 \times 10^{12}$ atoms/cm$^2$.

In an example that provides a dopant profile like the dopant profile of FIG. 2, the plurality of ion implant doses can comprise more five (5) ion implant doses of nitrogen into semiconductor region 14 to provide doped region 141. In an example, the nine ion implant doses can be in a range from about $1.0 \times 10^{11}$ atoms/cm$^2$ to about $2 \times 10^{12}$ atoms/cm$^2$ with ion implant energies in a range from about 30 keV to about 900 keV. In some examples, the ion implant energy is increased as the ion implant dose is increased. With this plurality of ion implants of nitrogen, the highest N-type dopant concentration is distal to or spaced apart from top side 11A of body of semiconductor material 11 as shown in FIG. 2. In some examples, the above sequence of ion implants can be in the in a step-wise increasing order where the ion implant dose and ion implant energy increases in each subsequent step. In other examples, any order can be used. In some examples, the plurality of ion implants provides a cumulative ion implant dose of about $6.0 \times 10^{12}$ atoms/cm². Doped region 141 is an example of a first doped region. In other examples, phosphorous can be used as the N-type dopant with modifications made, for example, to the ion implant energies.

Semiconductor device 10 comprises a doped region or regions 31 of a P-type conductivity within doped region 141. In some examples, doped region 31 is a single interconnected doped region, such as a plurality of connected stripe portions. In other examples, doped region 31 can be a plurality of separate doped regions, such as separate cell regions. In some examples, doped region 31 extends into doped region 141 to a depth in a range from about 0.5 microns and about 1.0 micron. Doped region 31 provides a body region or base region for the SiC MOSFET, a gate region for first JFET device 110, and a first JFET gate for second JFET device 120.

In accordance with the present description, doped region 31 comprises multiple vertically oriented parts or portions. In some examples, doped region 31 comprises a first portion 31A and a second portion 31B where first portion 31A is interposed between top side 11A of body of semiconductor material 11 and second portion 31B. That is, first portion 31A is proximate to top side 11A and second portion 31B is distal to or spaced apart from top side 11A. In accordance with the present description, second portion 31B comprises a retrograde portion that has a higher peak dopant concentration than first portion 31A. In some examples, second portion 31B is configured together with doped region 141 to control the JFET pinching of first JFET device 110 to suppress short-circuit current.

In some examples, first portion 31A and second portion 31B are formed using ion implantation. In some examples, first portion 31A is formed first followed by second portion 31B. In an example, first portion 31A is formed using an aluminum dopant with an ion implant dose between about $2.0 \times 10^{13}$ atoms/cm² and about $4.0 \times 10^{13}$ atoms/cm² and an ion implant energy of about 150 keV. In an example, second portion 31B is formed using an aluminum dopant with an ion implant dose between about $1.0 \times 10^{14}$ atoms/cm² and about $6.0 \times 10^{14}$ atoms/cm² and ion implant energy greater than about 400 keV. As will be described later, in some examples, second portion 31B can be self-aligned to first portion 31A using spacers that provide the implanted dopant for second portion 31B initially laterally inset with the respect to first portion 31A. Due to significant lateral straggle of the implanted dopant, the higher concentration of second portion 31B extends laterally into doped region 141 including first JFET channel region 141A to provide a more uniform PN junction profile and a narrower JFET channel distal to top side 11A. The more uniform PN junction provides, among other things, better pinch-off of first JFET channel region 141A leading to reduced current and less of a localized self-heating effect during a short-circuit event. Previous devices have been observed to have localized self-heating effects in this portion of the device. The increase in temperature causes an increase in resistance in the JFET channel in a self-amplifying manner. It was found practice that second portion 31B reduces this effect found in previous devices.

Figures 3A, 3B:
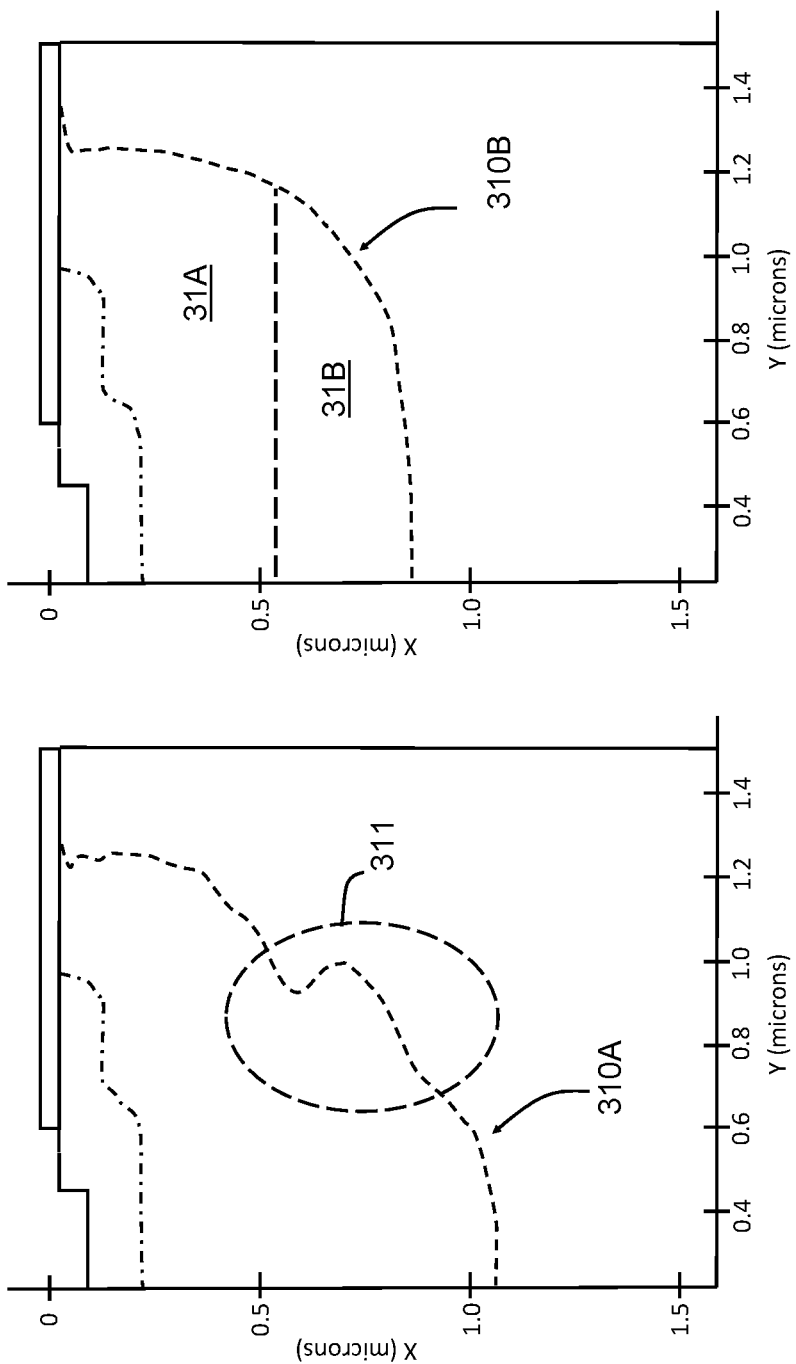
FIG. 3A illustrates a partial two-dimensional plot of a PN junction profile of a doped base region.
FIG. 3B illustrates a partial two-dimensional plot of a PN junction profile of a doped base region in accordance with the present description.

An example of the difference in PN junction profiles between a base region of a previous device and doped region 31 is shown in FIGS. 3A and 3B. More particularly, FIG. 3A shows a partial two-dimensional plot of a PN junction profile 310A of a previous base region that does not have second portion 31B. FIG. 3B shows a partial two-dimensional plot of a PN junction profile 310B that includes first portion 31A and second portion 31B in accordance with the present description. In was found in practice that PN junction profile 310A of the previous device had an irregular profile 311 that resulted in the unwanted localized self-heating described above. In contrast, PN junction profile 310B with second portion 31B has a more uniform profile resulting in better JFET pinching and a reduction in the localized self-heating during a short-circuit event thereby improving capability and durability.

Semiconductor device 10 further comprises a doped region 37 comprising N-type conductivity within doped region 31, and a doped region 34 comprising P-type conductivity within doped region 37. In some examples, which will be described in more detail later, doped region 37 can be self-aligned to doped region 31 and doped region 34 can be self-aligned to doped region 37. This provides for, among other things, semiconductor device 10 with smaller cell sizes. Doped region 37 provides a JFET channel region 37A for second JFET device 120, a first JFET source 37B for first JFET device 110, and a JFET drain 37B for second JFET device 120. JFET channel region 37A can also be referred to as a second JFET channel region to distinguish from first JFET channel region 141A. Doped region 34 provides a second JFET gate for second JFET device 120.

In some examples, doped region 37 has a peak dopant concentration in a range from about $5.0 \times 10^{18}$ atoms/cm³ to about $6.0 \times 10^{18}$ atoms/cm³ in JFET channel region 37A. In some examples, portion 37B of doped region can have a higher dopant concentration than JFET channel region 37A using another doping step. In some examples, doped region 34 has a peak dopant concentration in range from about $1.0 \times 10^{19}$ atoms/cm³ to about $2.0 \times 10^{19}$ atoms/cm³. Doped region 37 and doped region 34 can be formed using ion implantation techniques. In some examples, multiple ion implant doses can be used to provide portions 37A and 37B of doped region 37.

Semiconductor device 10 further comprises a doped region 33 comprising N-type conductivity within doped region 37, and a doped region 36 comprising P-type conductivity within doped region 37. In some examples and as will be described in more detail later, doped region 33 can be self-aligned to doped region 34. Doped region 33 provides a source region for the SiC MOSFET device and a JFET source region for second JFET device 120. Doped region 33 can also be referred to as a second JFET source region to distinguish from JFET source region 37B for first JFET device 110. Doped region 36 extends through a portion of doped region 33 and a portion of doped region 37 and is coupled to doped region 31. Doped region 36 provides a body contact for the SiC MOSFET device and a gate contact to the first JFET gate for second JFET device 120.

Semiconductor device 10 further comprises a gate dielectric 26 over top side 11A of body of semiconductor material 11 and laterally extends between adjacent doped regions 37 and doped region portions 31 with first JFET channel region 141A interposed between adjacent doped region portions 31. In some examples, gate dielectric 26 can comprise an oxide and can have a thickness in a range from about 250 Angstroms to about 600 Angstroms. A conductor 44A is provided over gate dielectric 26 and a conductor 44B is provided over portions of top side 11A and coupled to doped region 34, doped region 33, and doped region 36. In this configuration, doped region 34 is electrically shorted to doped region 33. In some examples, conductor 44A can comprise polysilicon or other conductive materials, and 44B can comprise nickel, nickel silicide, titanium, or other conductive materials as known to one of ordinary skill in the art. In some examples, a conductor 46 is provided over lower side 11B of body of semiconductor material 11 and coupled to substrate 12. In some examples, conductor 46 can comprise a plurality of metal layers, such as nickel-titanium-nickel-silver, chrome-nickel-gold, or other conductive materials as known to one of ordinary skill in the art. Conductors 44A, 44B, and 46 can be formed using deposition processes, such as evaporation, sputtering, or other techniques as known to one of ordinary skill in the art. In some examples, conductor 44A can be referred to as a gate control electrode, conductor 44B can be referred to a current carrying electrode or a source electrode, and conductor 46 can be referred to as a current carrying electrode or a drain electrode. With an appropriate gate voltage applied to conductor 44A a channel region 29 is formed in doped region 31 proximate to top side 11A that allows for current to flow in semiconductor device 10.

Figure 4A:
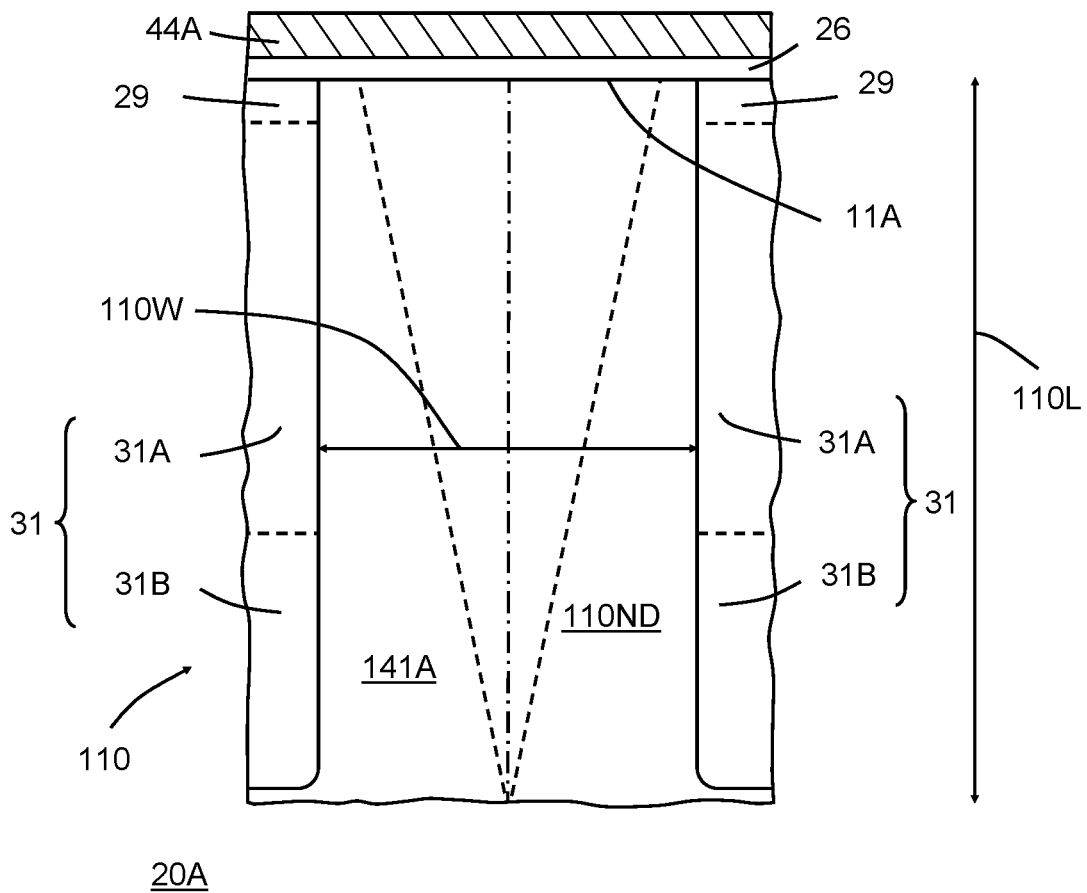
FIG. 4A illustrates an expanded cross-sectional view of a first JFET portion of a first JFET device noted by reference 20A in FIG. 1.

FIG. 4A illustrates an expanded cross-sectional view of first JFET region 20A of first JFET device 110 of semiconductor device 10. In accordance with the present description, first JFET device 110 can have structures and implementations that are highly tunable. For example, first JFET region 20A of FIG. 4A is illustrated comprising an N-type dopant concentration 110ND ($N_D$), a JFET channel width 110W ($W_{JFET}$), and a JFET channel length 110L (L). By selecting values for the parameters $N_D$, $W_{JFET}$, and L for first JFET device 110, it is possible to control pinch-off and saturation levels of short-circuit current.

More particularly, first JFET device 110 provides a structural means to tune operational characteristics of semiconductor device 10 to achieve desired results. For example, the doping Np of first JFET channel region 141A may be selected to provide a desired level of series resistance when semiconductor device 10 is in an on state, but to pinch-off at a specified high current, such as during a short circuit event.

To provide such tuning, the N-type dopant concentration 110ND ($N_D$), the JFET channel width 110W ($W_{JFET}$), and the JFET channel length 110L (L) can be selected and configured to cause pinch-off of first JFET device 110 to occur at a specified (for example, short-circuit) current. In some examples, for a given value of JFET channel length 110L (L), it is possible to control the parameter that is the product of $N_D * W_{JFET}$, which can be referred to as the JFET channel dose for first JFET channel region 141A. Similar operational characteristics can be obtained by other constructions, such as variations of one or more of N-type dopant concentration 110ND ($N_D$), JFET channel width 110W ($W_{JFET}$), or JFET channel length 110L (L)) by maintaining a constant ratio of $N_D * W_{JFET}/L$. In other examples, N-type dopant concentration 110ND ($N_D$) does not have to be constant, such as a doping profile that comprises an integral of the N-type dopant concentration across first JFET channel region 141A equates to $N_D * W_{JFET}$.

In some examples, values for N-type dopant concentration 110ND ($N_D$), JFET channel width 110W ($W_{JFET}$), and JFET channel length 110L (L) can include a JFET channel length of about L=1 microns with $N_D$=5.0×10$^{16}$ atoms/cm$^3$, and $W_{JFET}$=0.7 microns. That is, JFET channel length 110L (L) can be kept relatively short, for example on the order of 0.5 microns to about 1.5 microns. In summary, desired operational characteristics for short-circuit performance can be obtained using the ratio of channel dose to the selected channel length for first JFET device 110.

In accordance with the present description, when a drain voltage ($V_D$) of the JFET increases, a drain current ($I_D$) increases as well, until a saturation voltage ($V_{DSAT}$) is reached. At $V_{DSAT}$, the JFET current $I_D$ also reaches a saturation value $I_{DSAT}$. By reaching and maintaining the saturation value $I_{DSAT}$, short-circuit protection is provided and time is provided for fault protection mechanisms to be implemented. An advantage of having first JFET region 20A in series with the SiC MOSFET channel is that first JFET region 20A has a low on-resistance adding to the total on-resistance of the SiC MOSFET but has a pinch-off current that limits the maximum short-circuit of the SiC MOSFET. This is an improvement over previous SiC MOSFET devices.

Figure 4B:
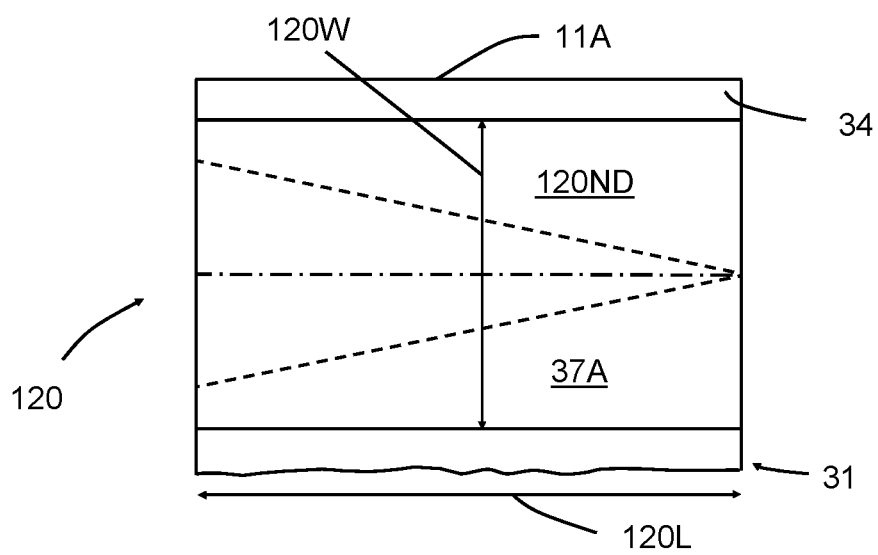
FIG. 4B illustrates an expanded cross-sectional view of a second JFET portion of a second JFET device noted by reference 20B in FIG. 1.

FIG. 4B illustrates an expanded cross-sectional view of second JFET region 20B of first JFET device 110 of semiconductor device 10. Similar to first JFET device 110, second JFET device 120 can have structures and implementations that are highly tunable. For example, second JFET region 20B of FIG. 4B is illustrated comprising an N-type dopant concentration 120ND ($N_D$), a JFET channel width 120 W ($W_{JFET}$), and a JFET channel length 120L (L). By selecting values for the parameters $N_D$, $W_{JFET}$, and L for second JFET device 120, it is possible to further control pinch-off and saturation levels of short-circuit current together with first JFET device 110 as described previously.

Figure 5:
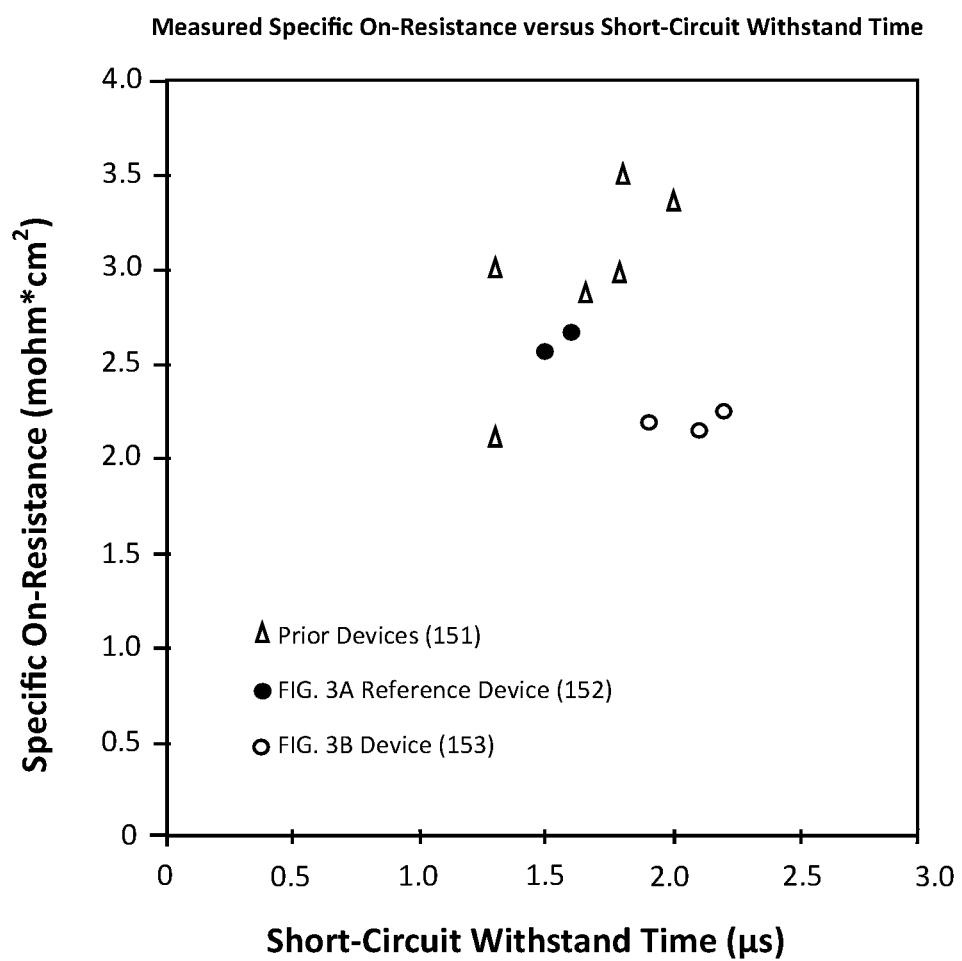
FIG. 5 graphically illustrates specific on-resistance (in milli-ohm*$cm^2$) versus short-circuit withstand time (in micro-seconds) data for semiconductor devices including a semiconductor device in accordance with the present description.

FIG. 5 graphically illustrates specific on-resistance (in milli-ohm*cm$^2$) versus short-circuit withstand time (in micro-seconds) data for semiconductor devices including semiconductor devices in accordance with the present description. More particularly, data sets 151 and 152 correspondence to data for prior SiC MOSFET devices without first JFET device 110 as described herein. More particularly, data set 152 corresponds to a semiconductor device in accordance with the PN junction profile of FIG. 3A. Data set 153 corresponds to data for semiconductor device including only first JFET device 110 with PN junction profile of FIG. 3B. That is, data set 153 is an example of semiconductor device 10 with first JFET device 110 in accordance with the present description but without second JFET device 120. As shown in FIG. 5, semiconductor device 10 has a longer short-circuit withstand time and lower specific on-resistance compared to the prior devices.

Turning now to FIGS. 6-15, an example device layout that supports a smaller cell pitch (for example, cell pitches in a range of about 4 microns or less) and an example method of manufacture is described for a semiconductor device in accordance with the present description. An example of such a semiconductor device can be semiconductor device 10 including variations thereof.

Figure 6:
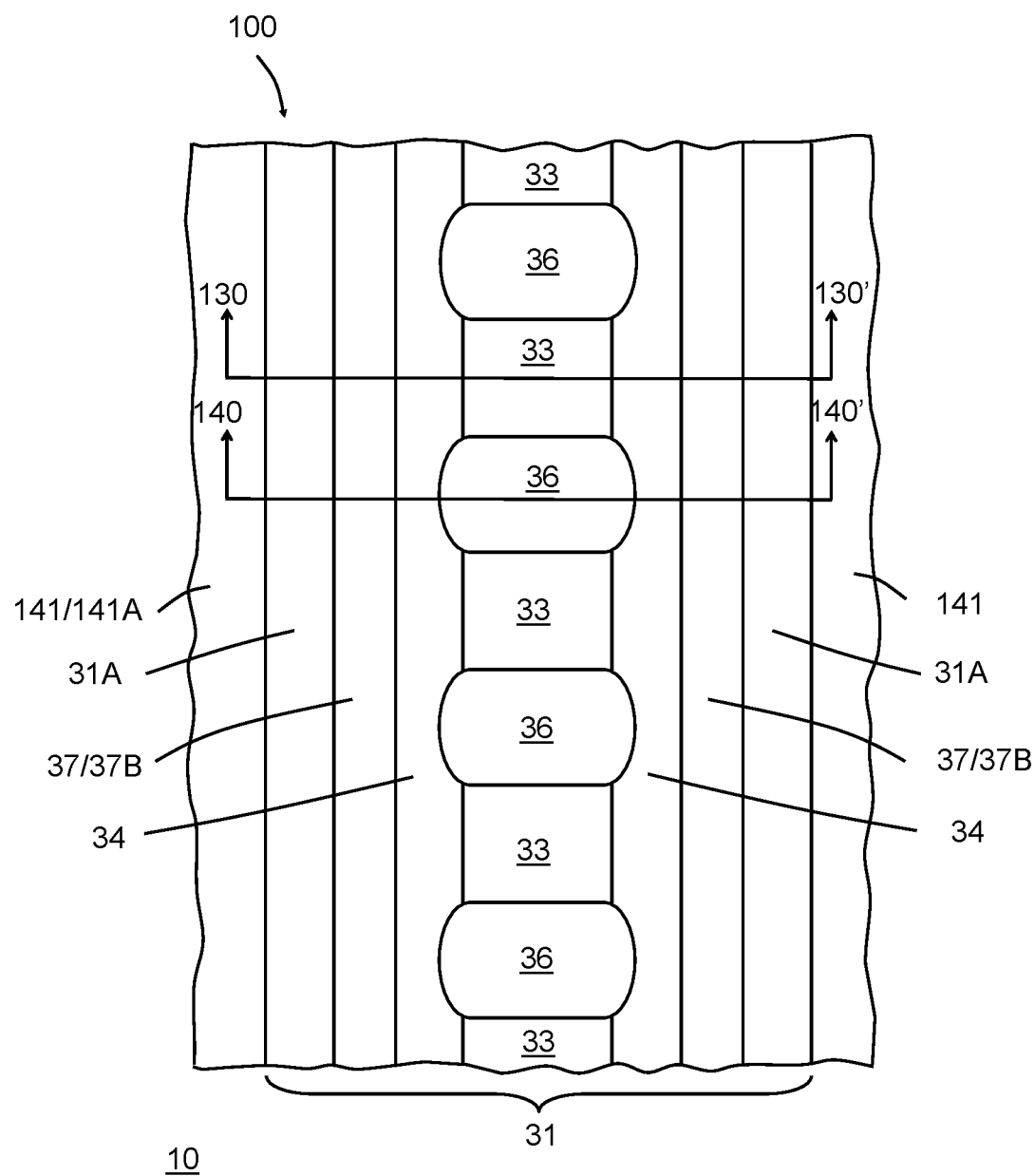
FIG. 6 illustrates a partial top view of a layout of a semiconductor device in accordance with the present description.

FIG. 6 illustrates a partial top view of a layout 100 of a semiconductor device, such as semiconductor device 10, in accordance with the present description. In some examples, layout 100 comprises a striped cell configuration where doped region 31 is provided as a plurality of generally parallel striped regions or portions, which can be coupled together at another portion of semiconductor device 10 (for example, proximate to a peripheral edge of semiconductor device 10). As illustrated in FIG. 6, layout 100 comprises doped region 31 (which includes first portion 31A) within doped region 141 (which includes first JFET channel region 141A). In addition, doped region 37 (which includes source region 37B for first JFET device 110) is provided within doped region 31, and doped region 34 is provided within doped region 37 in a nested striped configuration. Additionally, doped region 33 is provided within doped region 37 in a striped configuration with a plurality of individual doped regions 36 within doped region 33 and doped 37 in a spaced apart configuration.

Figure 7:
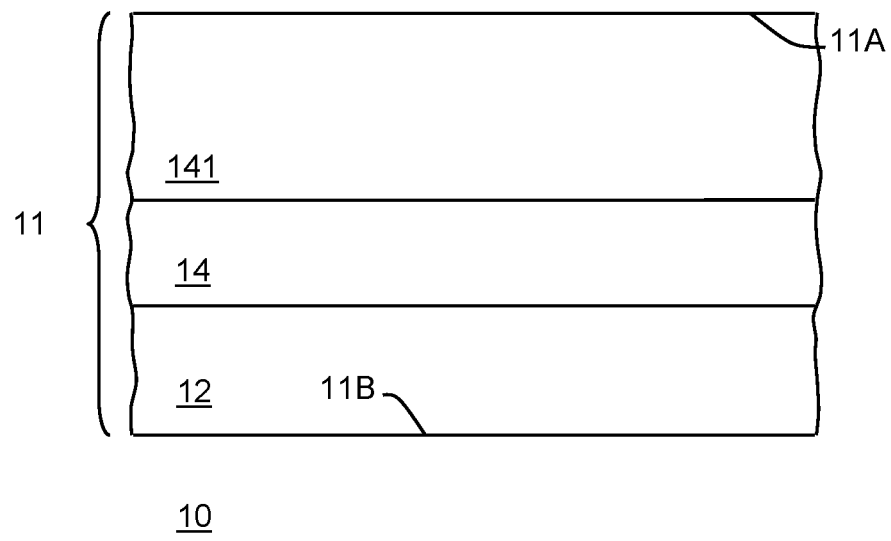
FIGS. 7, 8, 9, 10, 11, 12, 13, 14, and 15 illustrates partial cross-sectional views of the semiconductor device of FIG. 6 at various stages of manufacture in accordance with the present description.

FIG. 7 illustrates a partial cross-sectional view of a semiconductor device, such as semiconductor device 10, at an early step of fabrication in accordance with the present description taken along either reference line 130-130' or reference line 140-140' of FIG. 6. The method described is relevant to MOSFET devices, such as SiC MOSFET devices including high voltage SiC MOSFET devices. In the present example, the method is described in the manufacture of 1200 V SiC MOSFET device. In some examples, body of semiconductor material 11 is provided and comprises substrate 12 and semiconductor region 14. Body of semiconductor material 11 comprises top side 11A and lower side 11B opposite to top side 11A. Top side 11A can be an example of a first side and lower side 11B can be example of a second side.

In the present example, substrate 12 and semiconductor region 14 can comprise a first conductivity type, such as an N-type conductivity type. In some examples, substrate 12 can have a dopant concentration of about $5.0 \times 10^{18}$ atoms/cm$^3$ and semiconductor region 14 can have a thickness in range from about 8 microns to about 12 microns and dopant concentration in a range from about $7.0 \times 10^{15}$ atoms/cm$^3$ to about $1.5 \times 10^{16}$ atoms/cm$^3$.

In some examples, doped region 141 is provided within semiconductor region 14 can comprises the first conductivity type or N-type conductivity. Doped region 141 extends inward from top side 11A into semiconductor region 14. In some examples, doped region 141 has a depth from about 1 micron to about 2 microns from top side 11A. In accordance with the present description, doped region 141 provides first JFET channel region 141A for first JFET device 110 shown in FIG. 1. In some examples, doped region 141 can have a dopant concentration in a range from about $4.0 \times 10^{16}$ atoms/cm$^3$ to about $7.0 \times 10^{16}$ atoms/cm$^3$. As described previously in the description of FIGS. 1 and 2, doped region 141 can be provided using a plurality of doping steps, such as a plurality of ion implants with nitrogen as the N-type dopant source. In addition, the doping Np of first JFET channel region 141A may be selected to provide a desired level of series resistance when semiconductor device 10 is in an on state, but to pinch-off at a specified high current, such as during a short circuit event. Doped region 141 can be an example of a first doped region.

Figure 8:
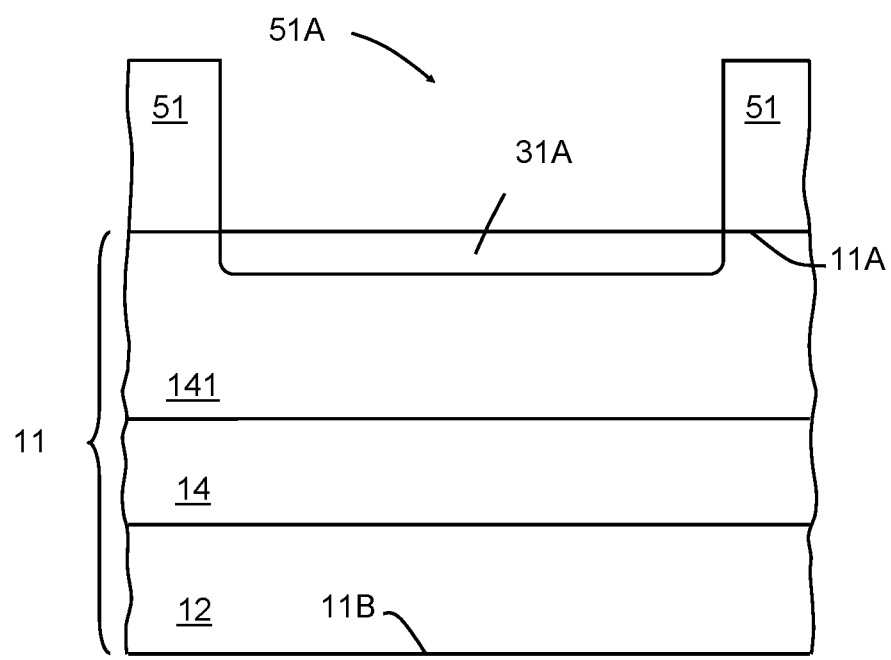

FIG. 8 illustrates a partial cross-sectional view of semiconductor device 10 at a later step in fabrication taken along either reference line 130-130' or reference line 140-140' of FIG. 6. In the present example, a first mask 51 is provide over top side 11A. First mask 51 comprises a first opening 51A above doped region 141. In some examples, first mask 51 comprises a dielectric material, such as an oxide. Opening 51A can be formed using photolithographic and etch techniques. In some examples, a dielectric structure is first provided over top side 11A followed by first mask 51. In some examples, the dielectric structure comprises an oxide-polysilicon-oxide structure. Opening 51A can then formed through first mask 51 and the dielectric structure. After opening 51A is formed, a first portion 31A of doped region 31 can be provided within doped region 141. First portion 31A comprises a second conductivity type opposite to the conductivity type or a P-type conductivity. First portion 31A can be formed using an aluminum dopant with an ion implant dose between about $2.0 \times 10^{13}$ atoms/cm$^2$ and about $4.5 \times 10^{13}$ atoms/cm$^2$ and an ion implant energy of about 100 keV to 200 keV.

Figure 9:
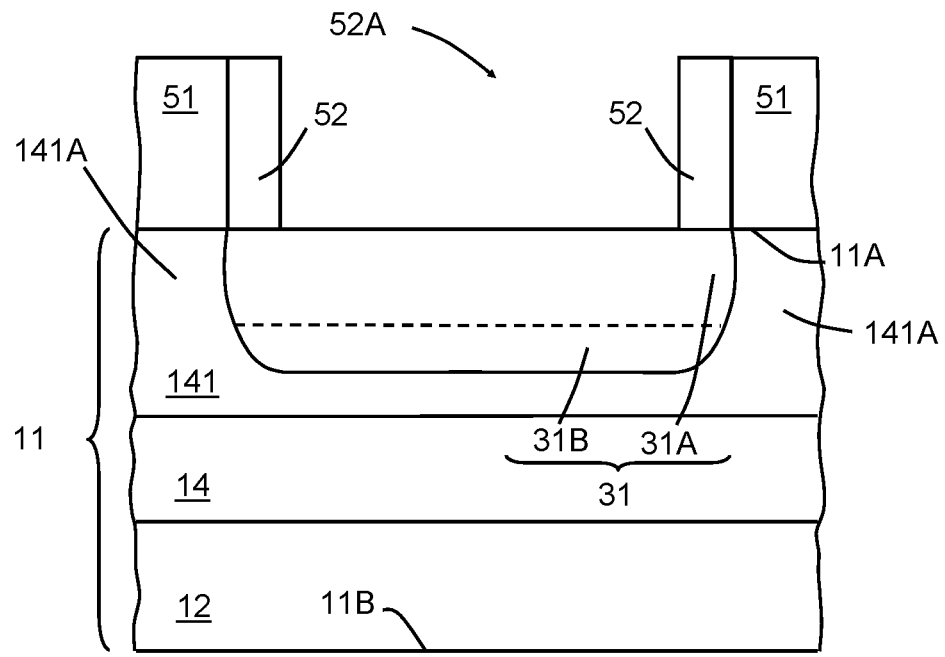

FIG. 9 illustrates a partial cross-sectional view of semiconductor device 10 at a later step in fabrication taken along either reference line 130-130' or reference line 140-140' of FIG. 6. In some examples, a first spacer structure 52 is provided within opening 51A, which defines a second opening 52A above first portion 31A. In some examples, a dielectric structure is formed over first mask 51 and top side 11A. Anisotropic etch techniques can be used remove portions of the dielectric structure but leaving first spacer structure 52 along sidewalls of first mask 51. In some examples, first spacer structure 52 can comprise an oxide or a combination of oxide and polysilicon.

After first spacer structure 52 is formed, second portion 31B of doped region 31 can be provided within first portion 31A and doped region 141 using first spacer structure 52 to self-align second portion 31B to first portion 31A. That is, in some examples second portion 31B is self-aligned to first portion 31A. In some examples, second portion 31B is formed using an aluminum dopant with an ion implant dose between about $1.0 \times 10^{14}$ atoms/cm$^2$ and about $6.0 \times 10^{14}$ atoms/cm$^2$ and ion implant energy greater than about 400 keV.

In some examples, first portion 31A and second portion 31B of doped region 31 are activated at an elevated temperature. During implantation of the dopant with energies around or greater than about 400 keV, the higher concentration of second portion 31B will, due to a significant lateral straggle of the implanted ions, extend laterally into doped region 141 including first JFET channel region 141A to provide a more uniform PN junction profile and narrower JFET channel distance to top side 11A. The high dose of high energy implanted ions provides a more abrupt PN junction that provides, among other things, a well-controlled narrow JFET channel leading to more efficient JFET pinching resulting in reduced current and less of a localized self-heating effect during a short-circuit event. As described previously, doped region 31 provides a body region for the SiC MOSFET, a gate region for first JFET device 110, and a first JFET gate for second JFET device 120. Doped region 31 can be an example of a second doped region.

Figure 10:
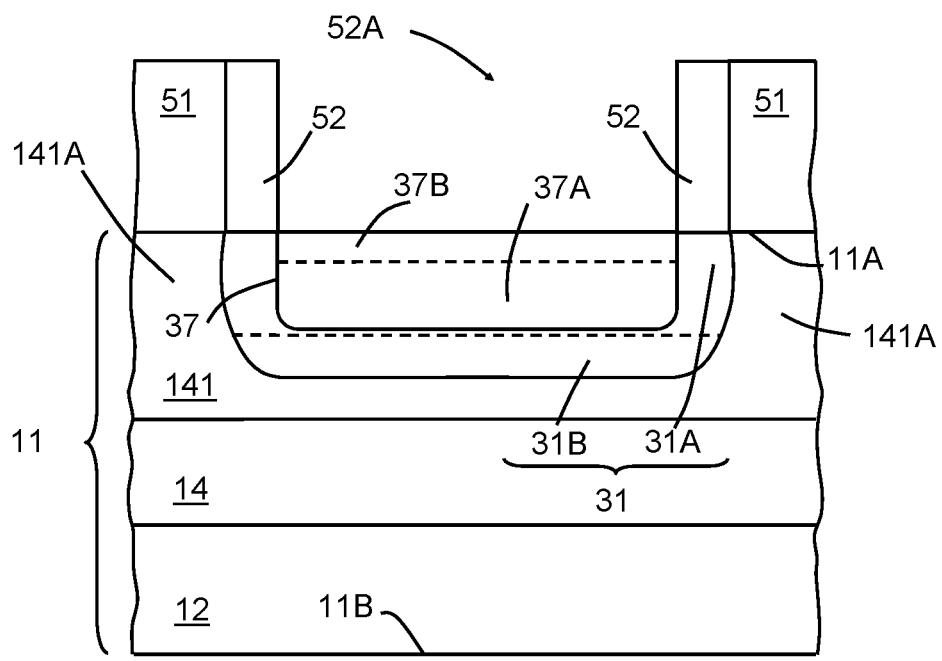

FIG. 10 illustrates a partial cross-sectional view of semiconductor device 10 at a later step in fabrication taken along either reference line 130-130' or reference line 140-140' of FIG. 6. In some examples, doped region 37 is provided within doped region 31 using first spacer structure 52 to self-align doped region 37 to first portion 31A of doped region 31. In the present example, doped region 37 comprises the first conductivity type or N-type conductivity. As described previously, doped region 37 provides a JFET channel region 37A for second JFET device 120, a first JFET source 37B for first JFET device 110, and a JFET drain 37B for second JFET device 120. In some examples, doped region 37 has a peak dopant concentration in a range from about $3.0 \times 10^{18}$ atoms/cm$^3$ to about $9.0 \times 10^{18}$ atoms/cm$^3$ in JFET channel region 37A and can be formed by a first ion implantation step. In some examples, portion 37B of doped region can have a higher dopant concentration than JFET channel region 37A and can be formed by another ion implantation step. As described previously, doped region 37 is configured to control pinch-off and saturation levels of short-circuit current for second JFET device 120. Doped region 37 can be an example of a third doped region.

Figure 11:
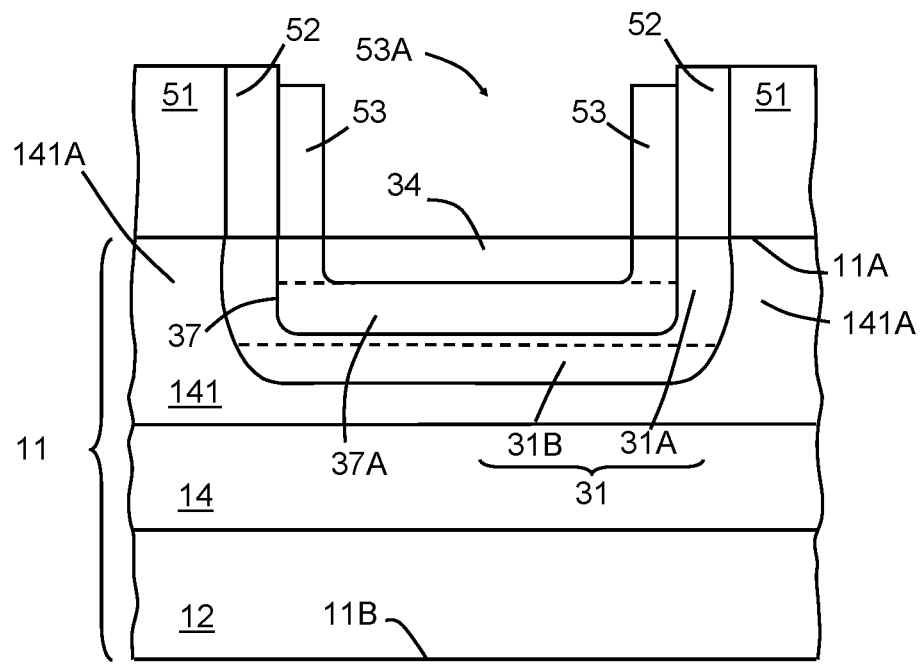

FIG. 11 illustrates a partial cross-sectional view of semiconductor device 10 at a later step in fabrication taken along either reference line 130-130' or reference line 140-140' of FIG. 6. In some examples, a second spacer structure 53 is provided within second opening 52A, which defines a third opening 53A above doped region 37. In some examples, a dielectric structure is formed over first mask 51, first spacer structure 52, and top side 11A. Anisotropic etch techniques can be used remove portions of the dielectric structure but leaving second spacer structure 53 along sidewalls of first spacer structure 52. In some examples, second spacer structure 53 can comprise an oxide or a combination of oxide and polysilicon.

After second spacer structure 53 is formed, doped region 34 comprising the second conductivity type or P-type conductivity is provided using second spacer structure 53 to self-align doped region 34 to doped region 37. That is, in some examples doped region 34 is self-aligned to doped region 37. In some examples, doped region 34 has a peak dopant concentration in range from about $1.0 \times 10^{19}$ atoms/cm$^3$ to about $2.0 \times 10^{19}$ atoms/cm$^3$. Aluminum ion implantation can be used to form doped region 34. As described previously, doped region 34 provides a second JFET gate for second JFET device 120. Doped region 34 can be an example of a fourth doped region.

Figure 12:
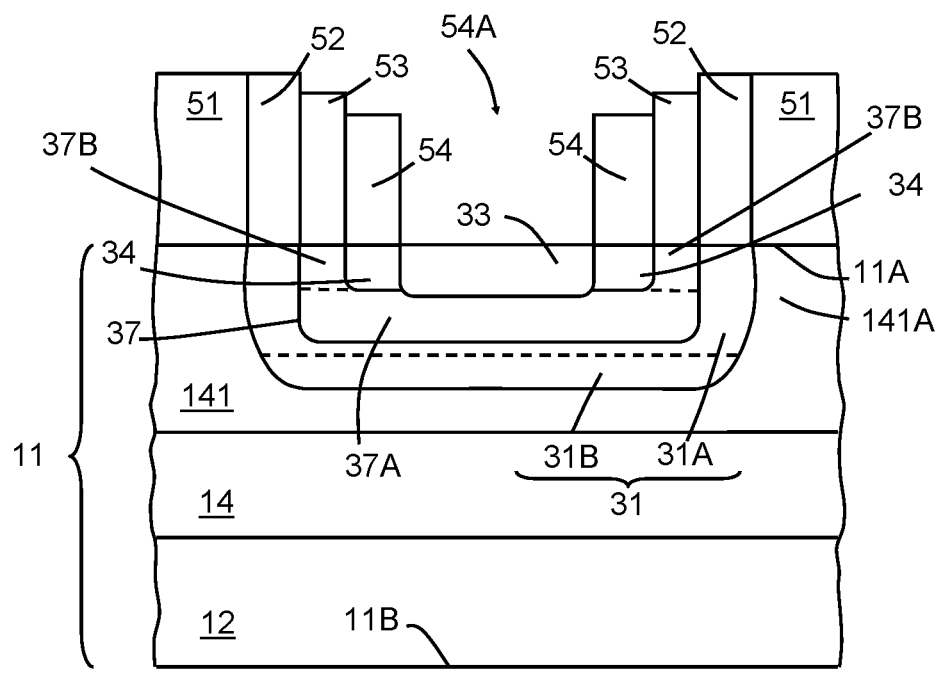

FIG. 12 illustrates a partial cross-sectional view of semiconductor device 10 at a later step in fabrication taken along, for example, reference line 130-130' of FIG. 6. In some examples, a third spacer structure 54 is provided within third opening 53A, which defines a fourth opening 54A above doped region 34. In some examples, a dielectric structure is formed over first mask 51, first spacer structure 52, second spacer structure 53, and top side 11A. Anisotropic etch techniques can be used remove portions of the dielectric layer but leaving third spacer structure 54 along sidewalls of second spacer structure 53. In some examples, third spacer structure 54 can comprise an oxide or a combination of oxide and polysilicon.

After third spacer 54 is formed, doped region 33 comprising the first conductivity or N-type conductivity is provided using third spacer structure 54 to self-align doped region 33 to doped region 34. That is, in some examples, doped region 33 is self-aligned to doped region 34. In some examples, doped region 33 comprises a stripe region that is continuous within doped region 37 as opposed to a plurality of doped region 33 within doped region 37. Doped region 33 can have a peak dopant concentration greater than about $3.0 \times 10^{19}$ atoms/cm$^3$ and can be formed using ion implantation techniques. In other examples, mask 51, first spacer structure 52, second spacer structure 53 can be removed and a separate hard mask can be provided and patterned with opening 54A to provide doped region 33. As described previously, doped region 33 provides a source region for the SiC MOSFET device and a JFET source region for second JFET device 120. Doped region 33 can be an example of a fifth doped region.

Figure 13:
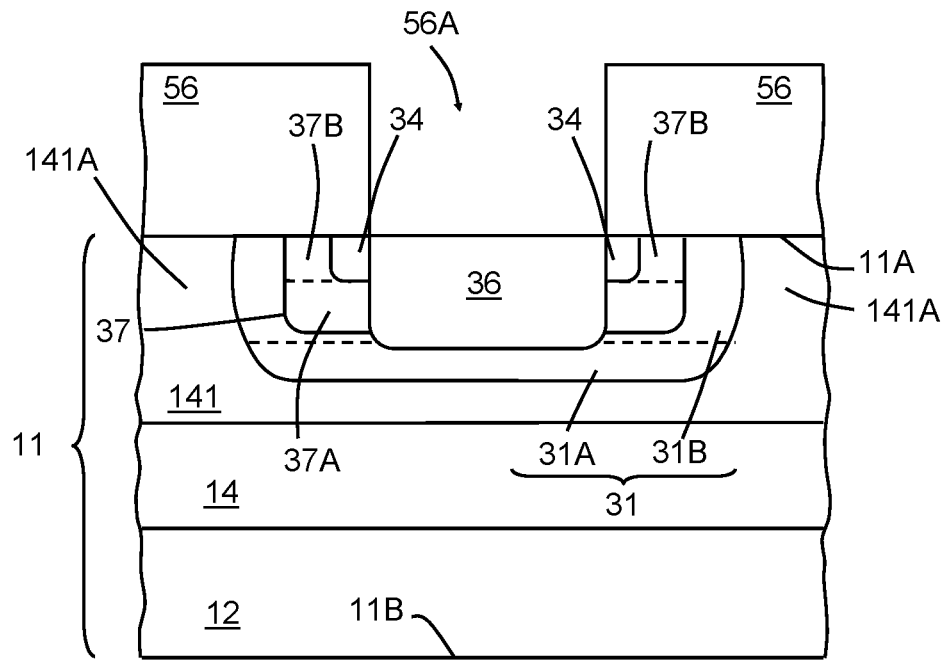

FIG. 13 illustrates a partial cross-sectional view of semiconductor device 10 at a later step in fabrication taken along reference line 140-140' of FIG. 6. In some examples, mask 51, first spacer structure 52, second spacer structure 53, and third spacer structure 54 are removed. A second mask 56 can then be formed over top side 11A and fifth openings 56A can be provided in a laterally spaced apart manner above doped region 33. Doped regions 36 can then be provided in portions of doped region 33 through fifth openings 56A. In the present example doped regions 36 comprise the second conductivity type or P-type conductivity. In some examples, doped regions 36 comprise a peak dopant concentration greater than about $5.0 \times 10^{19}$ atoms/cm$^3$ and can be formed using ion implantation techniques. Doped regions 36 extends through a portion of doped region 33 and a portion of doped region 37 and are coupled to doped region 31. As described previously, doped regions 36 provide a body contact for the SiC MOSFET device and a gate contact to the first JFET gate (doped region 31) for second JFET device 120. Doped region 36 can be an example of a sixth doped region.

Figure 14:
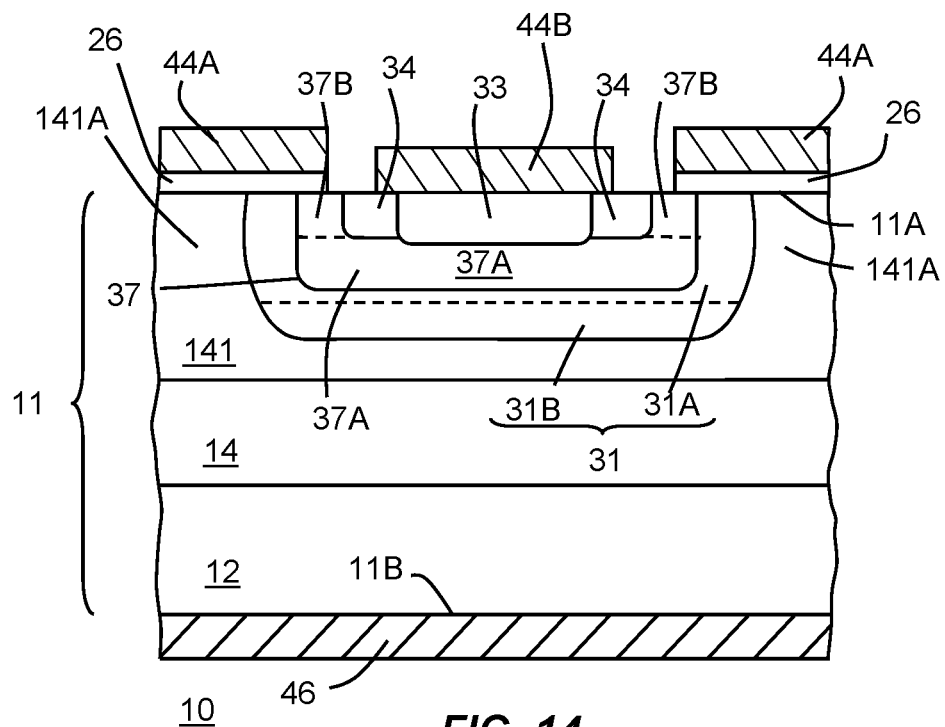
Figure 15:
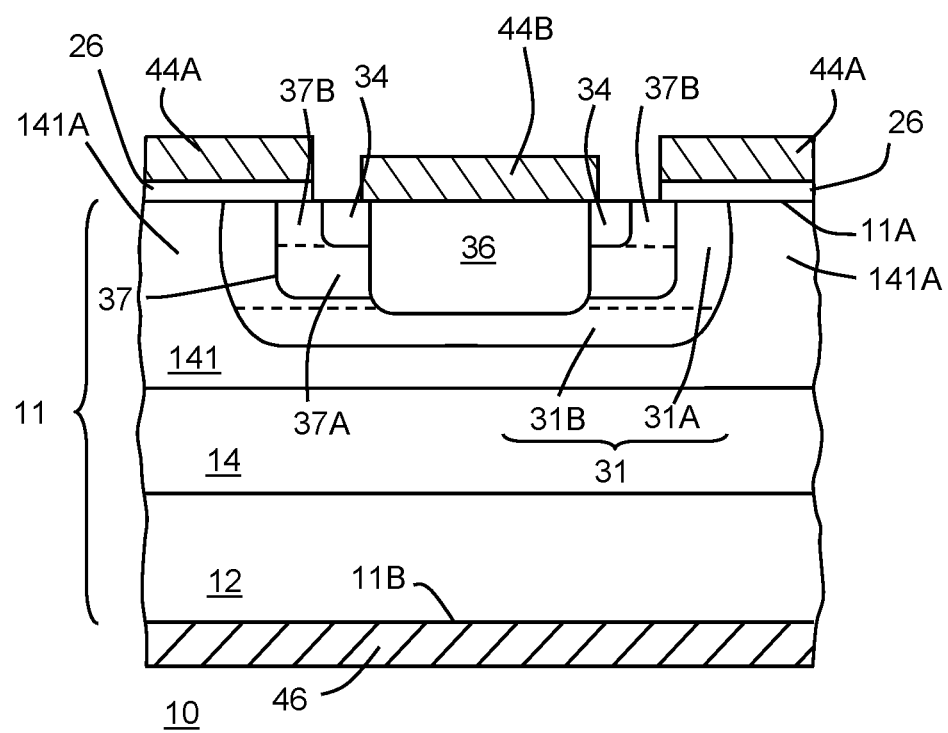

FIG. 14 illustrates a partial cross-sectional view of semiconductor device 10 with reference to the cross-section taken along reference line 130-130' of FIG. 6 at further processing. FIG. 15 illustrates a partial cross-sectional view of semiconductor device 10 with reference to the cross-section taken along reference line 140-140' of FIG. 6 after the further processing. In some examples, second mask 56 can be removed and gate dielectric 26 provided over portions of top side 11A. In subsequent steps, conductor 44A can provided over gate dielectric 26 and conductor 44B can be provided coupled to doped region 33, doped region 34, and doped region 36. Conductor 44B is configured to electrically short together doped region 33, doped region 34, and doped region 36 together. This provides the second gate region (doped region 34) for second JFET device 120 in a shorted gate to source configuration. In some examples, conductor 44A can comprise polysilicon or other conductive materials as known to one of ordinary skill in the art, and 44B can comprise nickel, nickel silicide, titanium, or other conductive materials as known to one of ordinary skill in the art.

In some examples, body of semiconductor material 11 can be thinned from lower side 11B to provide body of semiconductor material 11 with targeted thickness. Conductor 46 can then be provided over lower side 11B. In some examples, a conductor 46 is provided over lower side 11B of body of semiconductor material 11 and coupled to substrate 12. In some examples, conductor 46 can comprise a plurality of metal layers, such as nickel-titanium-nickel-silver, chrome-nickel-gold, or other conductive materials as known to one of ordinary skill in the art. Conductors 44A, 44B, and 46 can be formed using deposition processes, such as evaporation, sputtering, or other techniques as known to one of ordinary skill in the art.

In summary, a method and structure have been described for a semiconductor device having improved short circuit capability and durability. More particularly, a structure has been described that uses a first controlled pinch resistance in a first JFET region on a drain side of the semiconductor device. In some examples, a second controlled pinch resistance is added as part of a second JFET region on a source side of the semiconductor device to provide a plurality of controlled pinch resistances. A method has described that uses self-aligned techniques that enable fabrication of a smaller cell pitch. In some examples, the method further includes providing a retrograde P-type well region and one or more high energy N-type ion implants for controlling the pinch resistance in the first JFET region on the drain side. The structures and methods provide, among other things, improved short-circuit capability with a smaller impact on on-resistance compared to previously SiC semiconductor devices. This improved trade-off is beneficial in emerging applications, such as automotive inverters. The controlled pinch resistances are configured to provide short-circuit current saturation as an alternative to other approaches that reduce channel density or that increase channel length or series resistance.

It is understood that the different examples described herein can be combined with any of the other examples described herein to obtain different embodiments.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed.

As the claims hereinafter reflect, inventive aspects may lie in less than all features of a single foregoing disclosed example. Thus, the hereinafter expressed claims are hereby expressly incorporated into this Description, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A method for manufacturing a semiconductor device, comprising:
   providing a body of semiconductor material comprising:
      a substrate; and
      a semiconductor region over the substrate and comprising a first conductivity type, wherein the semiconductor region comprises a first side of the body of semiconductor and the substrate comprises a second side of the body of semiconductor material opposite to the first side;
   providing a first doped region comprising the first conductivity type within the semiconductor region, wherein the first doped region provides a first JFET channel region for a first JFET device;
   providing a first mask over the first side comprising a first opening above the first doped region;
   providing a second doped region comprising a second conductivity type opposite to the first conductivity type within the first doped region, wherein the second doped region provides a body region for a MOSFET device, a gate region for the first JFET device, and a first JFET gate for a second JFET device;
   providing a first spacer structure within the first opening to define a second opening smaller than the first opening;
   providing a third doped region comprising the first conductivity type within the second doped region aligned to the second opening, wherein the third doped region provides a second JFET channel region for the second JFET device, a first JFET source for the first JFET device, and a JFET drain for the second JFET device;
   providing a second spacer structure adjacent to the first spacer structure within the second opening to define a third opening smaller than the second opening;
   providing a fourth doped region of the second conductivity type within the third doped region aligned with the third opening, wherein the fourth doped region provides a second JFET gate for the second JFET device;
   providing a fifth doped region comprising the first conductivity type adjacent to the fourth doped region, wherein the fifth doped region provides a source for the MOSFET device and a second JFET source for the second JFET device; and
   providing a sixth doped region comprising the second conductivity type extending through a portion of the fifth doped region and coupled to the second doped region, wherein the sixth doped region provides a body contact for the MOSFET device and a gate contact to the first JFET gate for the second JFET device.

2. The method of claim 1, wherein providing the fifth doped region comprises:
   providing a third spacer structure adjacent to the second spacer structure within the third opening to define a fourth opening smaller than the third opening; and
   forming the fifth doped region aligned with the fourth opening.

3. The method of claim 1, wherein:
   the MOSFET device comprises a silicon carbide (SiC) MOSFET device.

4. The method of claim 1, wherein providing the first doped region comprises:
   forming the first JFET channel region with a dopant concentration $N_D$, a width W, and a length L configured to cause pinch-off of short-circuit current of the MOSFET device during a short-circuit event.

5. The method of claim 4, wherein providing the first doped region comprises:
   providing the first JFET channel region with a channel dose $N_D*W$ for a value of L configured to cause the pinch-off to occur at a specified short-circuit current.

6. The method of claim 1, wherein providing the second doped region comprises:
   first ion implanting a first portion of the second doped region at a first ion implant energy; and
   second ion implanting a second portion of the second doped region at a second ion implant energy greater than the first ion implant energy;
   wherein:
      the second portion is interposed between the first side of the body of semiconductor material and the first portion; and
      the first portion has a higher peak dopant concentration than the second portion.

7. The method of claim 6, wherein:
   the first ion implanting occurs before providing the first spacer structure; and
   the second ion implanting occurs after providing the first spacer structure.

8. The method of claim 6, wherein:
   the first ion implant energy is about 150 keV;
   the first ion implanting comprises an ion implant dose between about $1.0\times10^{13}$ atoms/cm$^2$ and about $6.0\times10^{13}$ atoms/cm$^2$;
   the second ion implant energy is greater than about 400 keV; and
   the second ion implanting comprises an ion implant dose between about $1.0\times10^{14}$ atoms/cm$^2$ and about $6.0\times10^{14}$ atoms/cm$^2$.

9. The method of claim 1, wherein providing the first doped region comprises:
   ion implanting a dopant of the first conductivity type using a plurality of ion implant doses including at least a first ion implant dose at a first ion implant energy in a range from about 30 keV to about 320 keV and at least a second ion implant dose at a second ion implant energy in a range from about 460 keV to about 900 keV.

10. The method of claim 9, wherein providing the first doped region comprises:
    ion implanting with the dopant comprising nitrogen with a cumulative ion implant dose between about $4.0\times10^{12}$ atoms/cm$^2$ and about $6.5\times10^{12}$ atoms/cm$^2$.

11. The method of claim 1, wherein:
    providing the body of semiconductor material comprises:

providing the semiconductor region comprising silicon carbide (SiC); and providing the semiconductor region with a dopant concentration; and providing the first doped region comprises providing the first doped region comprising a peak dopant concentration greater than the dopant concentration of the semiconductor region.

12. The method of claim 1, further comprising:

providing a conductor coupled to the sixth doped region, the fifth doped region, and the fourth doped region.

13. A method of manufacturing a semiconductor device, comprising:

providing a semiconductor substrate comprising a semiconductor region of a first conductivity type, a first side, and a second side opposite to the first side, the semiconductor region comprising a first dopant concentration, wherein the semiconductor substrate provides a drain for a MOSFET device and a first JFET drain for a first JFET device, and wherein at least the semiconductor region comprises silicon carbide (SiC);

providing a first doped region at the first side extending into the semiconductor region and comprising the first conductivity type and a second dopant concentration greater than the first dopant concentration, wherein the first doped region provides a first JFET channel region for the first JFET device;

providing a second doped region within the first doped region extending from the first side into the first doped region and comprising a second conductivity type opposite to the first conductivity type, wherein:

the second doped region provides a body region for the MOSFET device and a gate region for the first JFET device;

the second doped region comprises a first portion and a second portion;

the first portion is interposed between the first side and the second portion; and the second portion has a higher peak dopant concentration than the first portion; and providing a third doped region within and self-aligned to the second doped region and comprising the first conductivity type, wherein the third doped region provides a first JFET source for the first JFET device.

14. The method of claim 13, wherein providing the second doped region comprises:

ion implanting the first portion of the second doped region at a first ion implant energy less than about 150 keV and a first ion implant dose in a range from about $1.0 \times 10^{13}$ atoms/cm$^2$ and about $6.0 \times 10^{13}$ atoms/cm$^2$; and ion implanting the second portion of the second doped region at a second ion implant energy greater than about 400 keV and a second ion implant dose in a range from about $1.0 \times 10^{14}$ atoms/cm$^2$ and about $6.0 \times 10^{14}$ atoms/cm$^2$.

15. The method of claim 13, wherein providing the first doped region comprises:

ion implanting a dopant of the first conductivity type using a plurality of ion implant doses with at least one ion implant dose at ion implant energy in range from about 650 keV to about 900 keV, wherein:

the plurality of ion implant doses provides a total ion implant dose in a range from about $5.0 \times 10^{12}$ atoms/cm$^2$ to about $6.0 \times 10^{12}$ atoms/cm$^2$.

16. The method of claim 13, wherein providing the first doped region comprises:

forming the first JFET channel region with a doping concentration $N_D$, a width W, and a length L configured to cause pinch-off of short-circuit current of the MOSFET device during a short-circuit event.

17. The method of claim 13, wherein:

the second doped region provides a first JFET gate for a second JFET device;

the third doped region provides a second JFET channel region for the second JFET device and a second JFET drain for the second JFET device; and the method further comprises:

providing a fourth doped region comprising the second conductivity type within and self-aligned to the third doped region, wherein the fourth doped region provides a second JFET gate for the second JFET device;

providing a fifth doped region comprising the first conductivity type adjacent to the fourth doped region, wherein the fifth doped region provides a source for the MOSFET device and a second JFET source for the second JFET device;

providing a sixth doped region comprising the second conductivity type extending through a portion of the fifth doped region and connected to the first portion of the second doped region, wherein the sixth doped region provides a body contact for the MOSFET device, a gate contact to the gate region for the first JFET device, and a gate contact to the first JFET gate for the second JFET device; and providing a conductor electrically coupling the sixth doped region, the fifth doped region, and the fourth doped region together.

* * * * *